United States Patent [19]

Nagata et al.

[11] Patent Number: 4,688,138

[45] Date of Patent: Aug. 18, 1987

[54] ELECTROMAGNET DRIVE DEVICE

[75] Inventors: Osamu Nagata; Takashi Kajima, both of Kobe; Toshiharu Ozaki, Osaka, all of Japan

[73] Assignee: Technological Research Association of Highly Reliable Marine Propulsion Plant, Tokyo, Japan

[21] Appl. No.: 808,107

[22] Filed: Dec. 12, 1985

[30] Foreign Application Priority Data

Dec. 12, 1984 [JP] Japan .................................. 59-262232

[51] Int. Cl.⁴ .......................................... H01H 47/32
[52] U.S. Cl. .................................... 361/154; 123/490; 361/159; 361/167; 361/194; 361/210
[58] Field of Search ............... 361/154, 159, 166, 167, 361/194, 210; 123/490

[56] References Cited

U.S. PATENT DOCUMENTS 3,700,985 10/1972 Applequist ...................... 361/167 X
4,326,133 4/1982 Tasma .............................. 361/167 X
4,395,743 7/1983 Sunaga et al. .................. 361/166 X
4,503,480 3/1985 Pickard et al. .................. 361/154 X Primary Examiner—Michael L. Gellner
Attorney, Agent, or Firm—Cushman, Darby & Cushman

[57] ABSTRACT

A method and apparatus for driving an electromagnetic device includes two coils which selectively attract and repel a moving body. In order to allow a quick switching of the moving body between being attracted by one coil and the other, the current through the coil which is not holding the moving body in its magnetic field can be made to be a level higher than the current to the coil which is holding the body in its magnetic field. By reducing the current to the coil that is holding the body, the body can be rapidly switched to be within the magnetic field of the other coil. In addition, the currents to the respective coils can be increased before this switching occurs. Structure can also be provided across the coils to quicken the time it takes for the magnetic field to dissipate.

12 Claims, 8 Drawing Figures

ELECTROMAGNET DRIVE DEVICE

BACKGROUND AND SUMMARY OF THE INVENTION

The present invention relates to an electromagnet drive device operating, at high speed, an electromagnet device comprising a pair of electromagnets and a movable member moved by the electromagnetic force thereof. More precisely, this invention relates to an electromagnet drive device which is ideal for use in, for example, an electromagnetic valve for carrying out accurately fuel injection in a diesel engine or electromagnetic shut off valve.

The present invention includes a high speed control means whereby operation can be described beginning at a first state in which the first of a pair of coils is energized, and a movable element is magnetically held by that first coil. When that magnetic holding is desired to be released, and the movable element is desired to be held by the second coil instead of the first coil, the following sequence is used. First, with the first coil still in a holding state, the second coil is energized. When the attachment is to be switched over from the first coil to the second coil, the first coil is deenergized. When the magnetic holding of the first coil is to be removed, and instead of the movable member is to be held by the second coil, thus, with the state of holding by the first coil preserved, the energizing current flowing through the first coil is increased and the second coil is energized. Then, when the holding is to be switched over from the first coil to said second coil, the first coil is deenergized. Therefore, the movable element can be operated at high speed using a relatively low supply voltage.

FIG. 6 is an electric circuit diagram showing the construction of a typical conventional electromagnet drive device. A pair of electromagnets have their respective structural elements which are the coils SR and SL connected in parallel to a direct current supply E, and a relay switch RL is provided to switch the voltage supply between them. In parallel with the coils SR and SL are connected diodes CR and CL, biased in the opposite polarity to the energizing current applied. FIG. 7 is a timing chart of the electromagnet drive device of FIG. 6. In FIG. 7, (1) is the switchover command signal applied to the relay switch RL, (2) is the voltage waveform applied to the coil SR, (3) is the waveform of the current flowing through coil SR, (4) is the voltage waveform applied to the coil SL, and (5) is the waveform of the current flowing through coil SL. When the switchover command signal is low level, the contacts 1a of the relay switch RL are open, the contacts 1b are closed, and the coil SL is energized. When the switchover command signal changes from low level to high level, the relay switch RL switches over, the coil SR is energized and the coil SL is deenergized. At this point, the current IR flowing through the coil SR is, if the resistance component of the coil SR is taken as R1, the inductance component as L1, and the time as t, given by expression 1 as follows.

$$IR = \frac{E}{R1}(1 - e^{-(R1/L1)t}) \quad (1)$$

In other words, even when a voltage is applied to the coil SR, for an interval from the instant when the voltage is applied there is a transient state, and as shown in FIG. 7 (3), after the time interval T1 has elapsed, the current IR has reached its normal state. The current IL caused by the back e.m.f. produced when the coil SL is deenergized is conducted by the diode CL to flow as shown by the arrow A1, and is dissipated by the resistance component R2 of the coil SL. At this point, if the inductance component of the coil SL is L2, the current IL is given by expression 2 as follows.

$$IL = \frac{E}{R2} e^{-(R2/L2)t} \quad (2)$$

The voltage applied to the coil SL becomes zero, and the current IL produced by the back e.m.f. gradually decreases, as shown in FIG. 7 (5), over interval T2.

When an electromagnet drive device of this type drives a double solenoid type electromagnetic valve as described below and shown in FIG. 2, the movable element which is the switchover valve spool and the plungers of the pair of electromagnets are subject to a force. This force is the difference between the electromagnetic attraction force produced by the current IR flowing through the coil SR, and, working against this, the electromagnetic attraction force produced by the current IL flowing through the coil SL when the switchover signal switches from the low level to the high level. When the force produced by IR exceeds the latter the movable element moves from the side of the right hand coil SR to the side of the left hand coil SL in time interval T3 as shown in FIG. 7 (6). Also, when the switchover signal switches from the high level to the low level, the coil SL is energized and the coil SR is deenergized, whereupon the movable element is moved to the right by the action of the force which is the difference between the electromagnet attraction force of the coil SL and the electromagnet attraction force of the coil SR.

For the movable element to be moved at high speed by electromagnetic force as described above, the current flowing through the energized coil must be increased rapidly, and also the current flowing through the deenergized coil must be decreased rapidly. Since, however, there is an inductance component in the coils, the rate of change of the respective currents is limited, and it is not possible to make the time interval T to move the movable element much shorter. From expression (1) above, if the supply voltage is increased, the energizing current apparently rises rapidly. However, in practice since the normal value of the energizing current also increases, the coil temperature rises, and the resistance component increases, so that no great benefit can be obtained. If, moreover, in an attempt to increase the speed of movement of the movable element an excessive voltage is applied to the coil, the coil will burn out, so that there are limits to increasing the supply voltage.

FIG. 8 shows an example of typical electromagnet attraction force characteristics. The relation between the electromagnet attraction force F and the electromagnet gap δ which causes the effective magnetic flux contributing to the attraction force is shown with the energizing current I as a parameter. In the drawing, δ max is the maximum value of the gap δ, and δ min the minimum value of the gap δ; the energizing currents I are such that Ia is less than Ib which is less than Ic which in turn is less than Id. When the energizing current I is Ib, when the gap δ is the maximum value δ max, the attraction force is taken as Fa, and when the gap δ is the minimum value δ min the attraction force is taken as Fb. A pair of electromagnets having such characteristics is used as follows, in for example the construction of a double solenoid electromagnetic valve of FIG. 2 described later. That is, when the first electromagnet is attracting its plunger with the gap δ min, it will be producing the attraction force Fb. The second electromagnet coil is energized with the gap δ max or that it will be producing the attraction force Fa. At this point, if the difference (Fb−Fa) of the attraction forces is greater than the external forces acting on the switchover valve spool, for example a spring force or fluid force (that is forces acting on the spool as a result of fluid flow), then the spool will remain moved to the side of the second electromagnet, and that state will be preserved. From this state, if the current energizing the coil of the first electromagnet is suddenly removed, the attraction force Fb will disappear, and only the attraction force Fa will act on the spool. Thus the spool will move at high speed to the side of the first electromagnet.

According to the present invention, on the occasion of changing from the state in which the first coil is energized and a movable element is magnetically held by that first coil, to the state where the movable element is held by the second coil, certain operations are followed. Specially, while still in the state that the holding of the first coil is maintained, the second coil is energized, and the first coil is deenergized. Similarly, when switching to holding by the second coil, the energizing current of the second coil is increased and the first coil is deenergized. When switching over the holding, while still in the state of maintaining the holding of the first coil, the energizing current of the first coil is increased and after energizing the second coil, the first coil is deenergized. The present invention also encompasses a circuit being provided for each coil, comprising a diode connected with opposite polarity to the polarity of the energizing current, and a nonlinear element which conducts when the coil back e.m.f. exceeds a certain predetermined value.

DETAILED DESCRIPTION OF THE PREFERRED EMBODIMENTS

Figure 1:
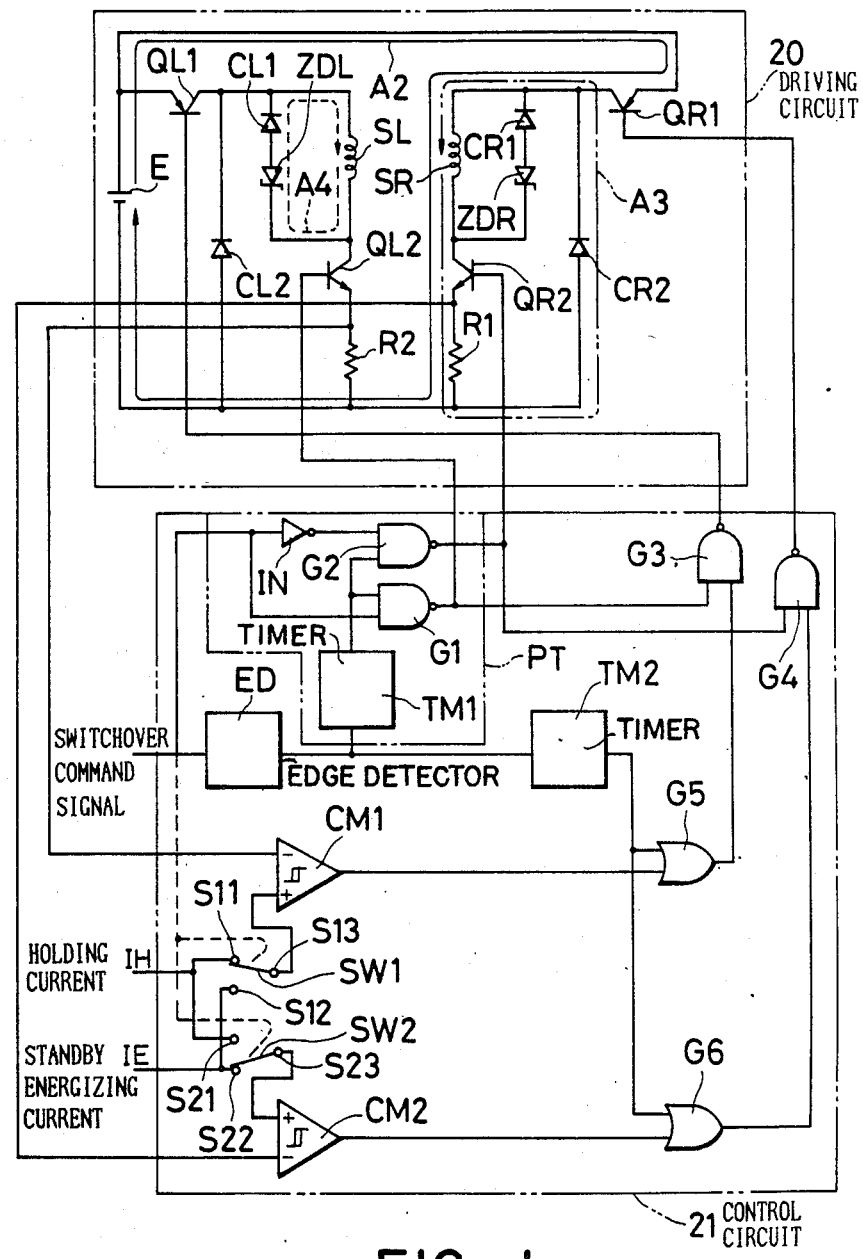
FIG. 1 is an electrical circuit diagram showing the construction of an electromagnet drive circuit of the present invention.
Figure 2:
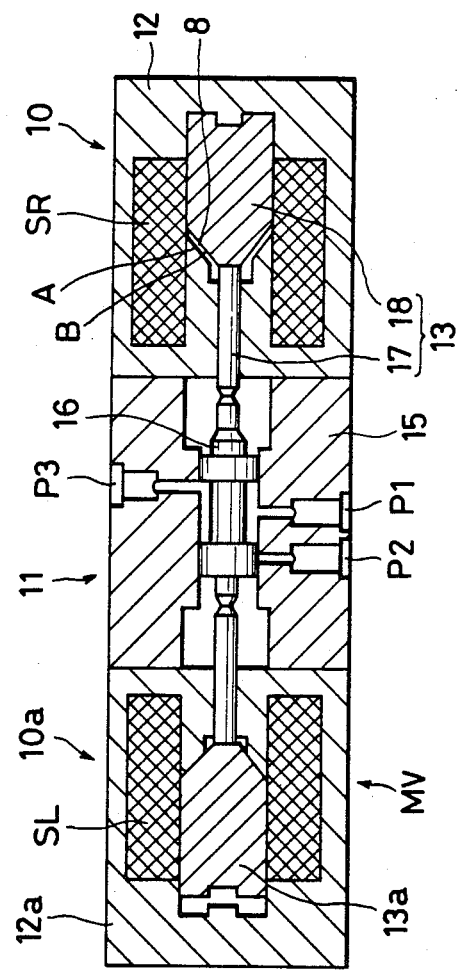
FIG. 2 is a sectional view of one example of an electromagnetic valve MV driven by the electromagnet drive circuit shown in FIG. 1.

FIG. 1 is a circuit diagram showing the construction of one embodiment of an electromagnet drive device of the present invention, and FIG. 2 shows an example of electromagnets operated by the electromagnet drive device of the present invention.

The electromagnetic valve MV shown in FIG. 2 has a pair of left and right electromagnets 10 and 10a, and a switchover valve 11. The first electromagnet 10 has a plunger 13 guided axially within a yoke 12, and a coil SR fitted so as to surround the plunger 13. The second electromagnet 10a includes a coil SL, and is of a symmetrical construction to the electromagnet 10. The switchover valve 11 is constructed with a spool 16 guided axially within a casing 15. The plunger 13 is constructed with a shaft portion 17 connected to the spool 16 and a cylindrical core 18 fixed to the shaft portion 17. If a current is passed through the coil SR, an attraction force is produced by the magnetic flux occurring in the gap 8 between the inner end surface A of the yoke 12 and the end surface B of the core 18 of the plunger 13 opposing said end surface A, and the plunger 13 will move to the left in the drawing. When the coil SR of the electromagnet 10 is energized and the coil SL included in the electromagnet 10a is deenergized, the spool 16 will be pushed by the plunger 13 and will move to the left, so that port P1 and port P2 will communicate. When the coil SR of the electromagnet 10 is deenergized and the coil SL of the electromagnet 10a is energized, the spool 16 will be pushed by the plunger 13a of the electromagnet 10a and will move to the right, so that port P1 and port P3 will communicate.

An example of an electromagnet drive device to drive the electromagnets 10 and 10a of this type of electromagnetic valve MV includes, as shown in FIG. 1 a drive circuit 20 and control circuit 21. The drive circuit 20 is constructed including a pair of coils SR and SL, a direct current supply E, transistors QR1, QL1, QR2 and QL2 which are switching elements, resistors R1 and R2 for current detection, a diode CR1 connected with the opposite polarity to the direction of flow of the energizing current of the coil SR, a Zener diode ZDR connected with the opposite polarity to the polarity of the back e.m.f. generated in the coil SR, similarly connected to the coil SL a diode CL1 and a Zener diode ZDL, a diode CR2 connected with the opposite polarity to the energizing current of the coil SR, and a diode CL2 connected with the opposite polarity to the energizing current of the coil SL.

The control circuit 21 is constructed from an edge detector ED which detects rising and falling edges in a switchover command signal for switching over the position of the spool of a switchover valve, a pre-energizing timing circuit PT which sets the timing for carrying out pre-energizing of the coils SR and SL, two switchover switches SW1 and SW2, a timer circuit TM2, comparators CM1 and CM2 having hysteresis characteristics, and a number of logic gates. The pre-energizing timing circuit PT comprises a timer circuit TM1, a NOT circuit IN, and NAND gates G1 and G2.

Figure 3:
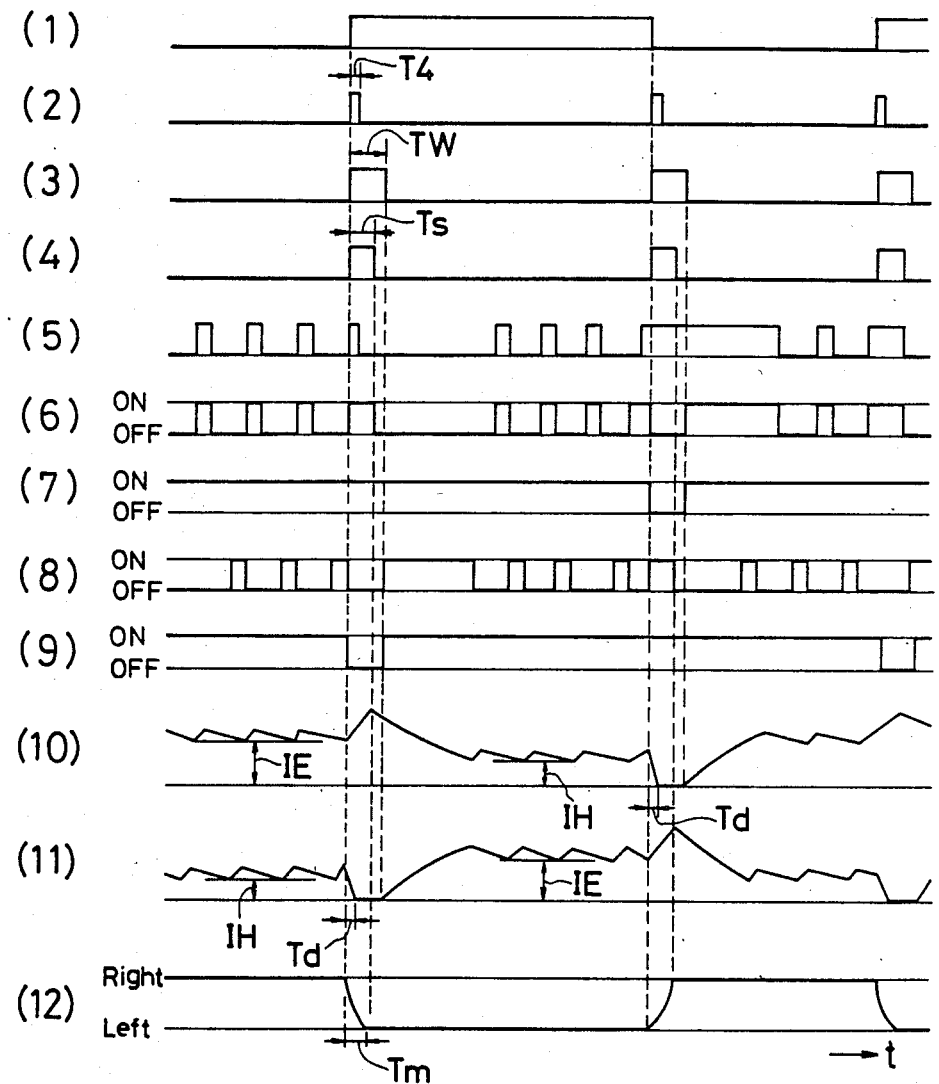
FIG. 3 is a timing chart explaining the operation of the electromagnet drive circuit shown in FIG. 1.

FIG. 3 is a timing chart of the embodiment of FIG. 1, and (1) shows the switchover command signal, (2) the output signal of the edge detector ED, (3) the output signal from the timer circuit TM1, (4) the output signal from the timer circuit TM2, (5) the output of comparator circuit CM2, (6) the operating state of transistor QR1, (7) the operating state of transistor QR2, (8) the operating state of transistor QL1, (9) the operating state of transistor QL2, (10) the current waveform flowing through the coil SR, (11) the current waveform flowing through the coil SL, and (12) the position changes of the spool 16 of the switchover valve 11.

When the spool 16 in FIG. 2 is moved to the right in the drawing, and the electromagnet 10a is in the attracting state, the switchover command signal is low level, and the output of the edge detector ED is low level. In this state the timer circuit TM1 is not operated, its output will be low level, and the outputs of NAND gates G1 and G2 are both high level, as a result of which the transistors QR2 and QL2 will be in the on state. The switchover command signal will cause switchover switch SW1 to have separate terminal S11 and common terminal S13 connected, and a voltage corresponding to the holding current IH will be applied to the non-inverting terminal of comparator CM1. The switchover command signal will cause switchover switch SW2 to have separate terminal S22 and common terminal S23 connected, and a voltage corresponding to the standby energizing current IE will be applied to the non-inverting terminal of comparator CM2. When the current flowing through the coil SR is smaller than the standby energizing current IE value, the output of the comparator CM2 will become high level, causing the transistor QR1 to be turned on through gates G6 and G4, and current to be supplied from the direct current supply E in the direction shown by the solid line arrow A2.

Then when the value of the current flowing through the coil SR becomes greater than the sum of the standby energizing current value IE and the magnitude of the hysteresis value of the comparator CM2, the output of the comparator CM2 will go from high level to low level, and the transistor QR1 will go into the off state. Thus the current flowing in the coil SR will flow through the diode CR2 as shown by the dot-dot-dash line arrow A3, and will progressively diminish. Then, when it again becomes less than the standby energizing current value IE, the transistor QR1 will become on. As a result, since the on/off operation of the transistor QR1 is repeated, the coil SR will be driven in the chopper mode of the standby energizing current IE as shown in FIG. 3 (10). On the other hand, the current flowing through the coil SL detected by the resistor R2 is compared with the holding current value IH in the comparator CM1, and when the current flowing through the coil SL has become smaller than the holding current IH the output of the comparator CM1 will be high level, and when it has become greater than the sum of the holding current value IH and the magnitude of the hysteresis value of the comparator CM1, that output will go to low level. When the output of the comparator CM1 is high level, the output of NAND gate G3 will be low level, and when the output of the comparator CM1 is low level, the output of NAND gate G3 will be high level. As a result, since the on/off operation of the transistor QL1 is repeated, the coil SL will be driven in the chopper mode of the holding current value IH as shown in FIG. 3 (11).

In the timing chart shown in FIG. 3 (10) and FIG. 3 (11) the current flowing through the coil SR is greater than the current flowing through the coil SL, but the electromagnet gap on the side of the coil SL is minimum, and the gap on the side of the coil SR is maximum, so that the attraction force of the electromagnet 10 on the side of the coil SR is smaller than the attraction force of the electromagnet 10a on the side of the coil SL. Therefore the spool of the switchover valve will remain pressed to the right as shown in FIG. 2.

When the switchover command signal changes from low level to high level, the edge detector ED detects this rising edge, and outputs a high level signal for exactly the interval T4 shown in FIG. 3 (1), and the timer circuits TM1 and TM2 operate. Thus the timer circuit TM1 outputs a high level output for exactly a time interval TW, as shown in FIG. 3 (3). Even if the high level output of timer circuit TM1 is applied to the NAND gate G2, since the output of NOT circuit IN is low level, the output of gate G2 will remain in the high level state, and the transistor QR2 will continue in the on state as shown in FIG. 3 (7). On the other hand, when the high level output of the timer circuit TM1 is applied to the NAND gate G1, so that for the interval Tw, the output of the NAND gate G1 will be low level, and the transistor QL2 will adopt the off state as shown in FIG. 3 (9). When the transistor QL2 goes into the off state, the current flowing through the coil SL will flow in a direction through the Zener diode ZDL and diode CL1 as shown by the broken line arrow A4, and will rapidly dissipate. When the output of the timer circuit TM2 goes high level for exactly the time interval Ts, the transistor QR1 will be turned on forcibly through the OR Gate G6 and NAND gate G4, and the current flowing in the coil SR will increase. In other words, the current in the coil SL of the electromagnet, which was attracting, will be rapidly dissipated, and the current flowing in the coil SR of the electromagnet, which is newly attracting, will increase further beyond the value IE of the standby energizing current. Thus, by increasing the attraction force, as shown in FIG. 3 (12), the spool 16 of the switchover valve 11 can be moved to the left at an extremely high speed. At this time, the switchover switch SW2 has separate terminal S21 and common terminal S23 connected, and the holding current valve IH is input to the non-inverting terminal of the comparator CM2. When the output of timer circuit TM2 becomes low level an interval Ts later, the output of the OR gate G6 is controlled by the output of the comparator CM2, and the transistor QR1 goes into an on/off state depending on that output, and the coil SR is driven by the holding current IH in chopper mode as shown in FIG. 3 (10). On the other hand, because the standby energizing current value IE is applied through the switchover switch SW1 to the comparator CM1, and the transistor QL1, since after an interval Tw has elapsed the output of the NAND gate G1 is restored to the high level, is put in an on/off state by the output of the comparator CM2, the coil SL, as shown in FIG. 3 (11), will be driven in chopper mode at a rated current value of the standby energizing current value IE. At this time the spool 16 of the switchover valve 11 will remain urged to the left for the same reason as when the switchover command signal is at the high level.

When the switchover command signal goes from the high level to the low level, the edge detector ED again detects the falling edge in this signal, the timer circuits TM1 and TM2 are activated, the current flowing in the coil SR is rapidly dissipated, the current flowing in the coil SL is increased. A2 shown in FIG. 3 (12), the spool 16 of the switchover valve 11 is thus moved to the right. In order to increase the frequency of switching the switchover valve, the set time Tw of the timer circuit TM1 is set slightly longer than the current dissipation time Td of the coils SR and SL as shown in FIG. 3 (10)

and FIG. 3 (11), and the set time Ts of the timer circuit TM2 is set equal to or slightly longer than the spool movement time Tm.

In the present embodiment, the standby energizing current value is made large, the attraction force is made large, and the holding current is made small, in order to make short the dissipation time Td of the current flowing through the coils SR and SL, but the standby energizing current IE and the holding current IH may be made equal to one another in order to simplify the drive device.

In the present invention, the dissipation time Td of the current flowing through the coils SR and SL only is concerned, and the speed of rising of the energizing current is quite irrelevant, as a result of which a relatively low supply voltage may be used. From expression (1) cited in the prior art, if the required peak current (current required to obtain the spool movement time T3) when energizing is ID, and the coil inductance is L, the time Tr to reach this is given by:

$$Tr = \frac{L}{E} \cdot ID \qquad (3)$$

On the other hand, if the Zener voltage is VZ, the time Th from the holding current IH until the energizing current is dissipated is given by:

$$Th = \frac{L}{VZ} \cdot IH \qquad (4)$$

The value of the holding current IH may be made between ½ and 1/5 of the required peak energizing current ID, and rather than making the supply voltage E large, it is easier from the point of view of circuit design to make the Zener voltage VZ large, and therefore compared with current technology a great speed improvement may be made. It should be noted that although a Zener diode has been used as the nonlinear element in the dissipation circuit, a varistor (voltage dependent resistor element) may equally be used to the same effect.

Figure 4:
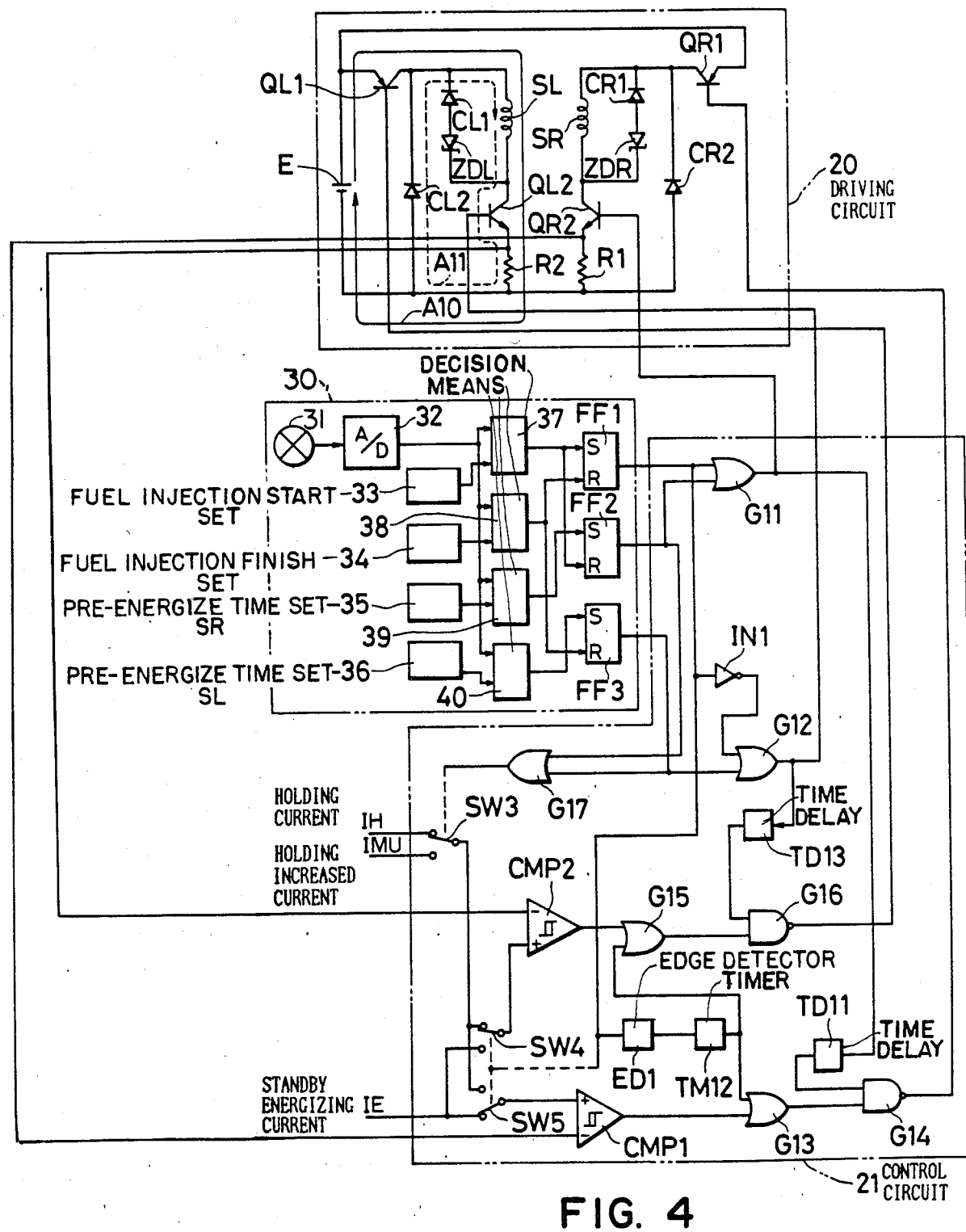
FIG. 4 is a circuit diagram showing an embodiment of the present invention applied to the fuel injection control device 30 of an internal combustion engine.
Figure 5:
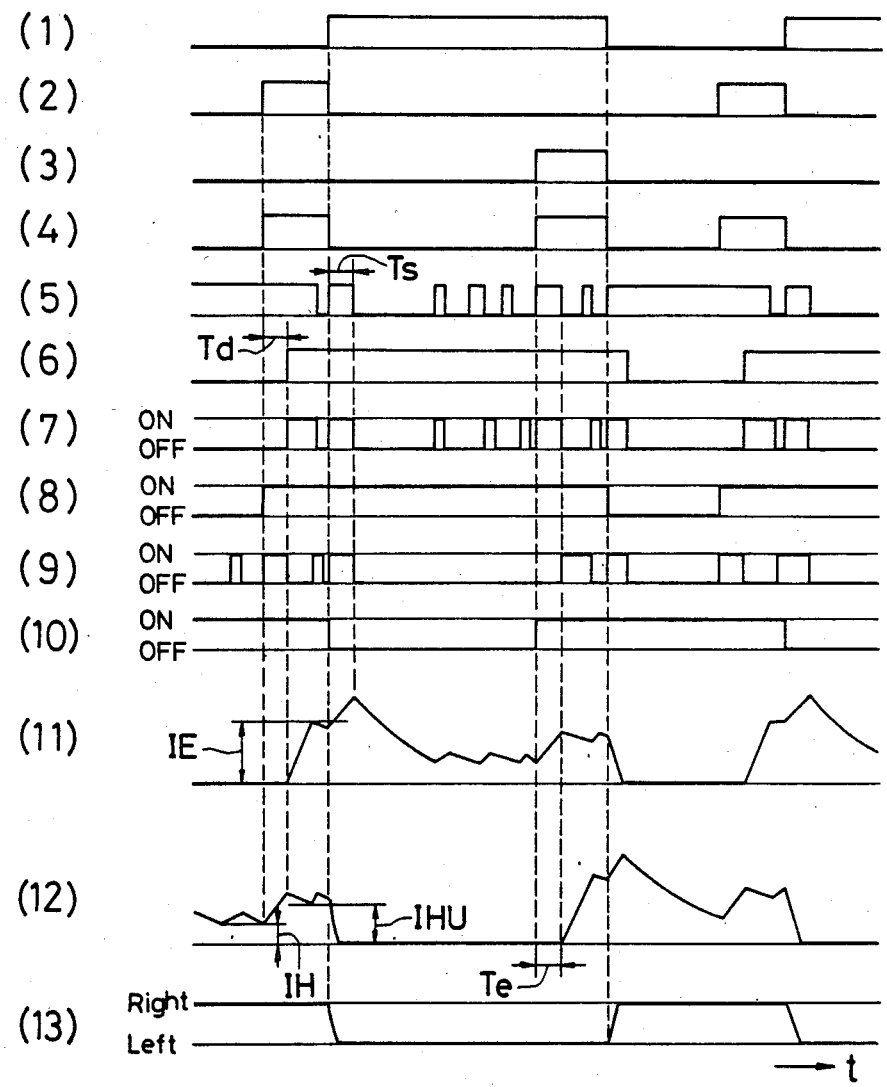
FIG. 5 is a timing chart explaining the operation of the embodiment shown in FIG. 4 applied to the fuel injection control device 30 of an internal combustion engine.
Figure 6:
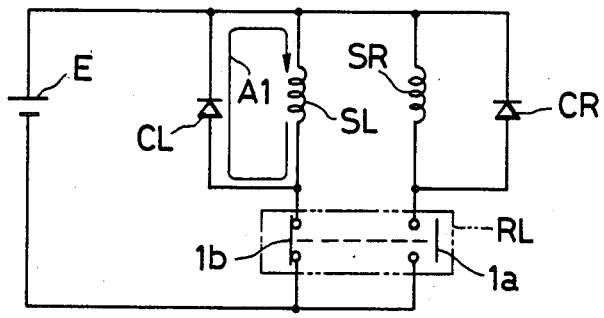
FIG. 6 is an electrical circuit diagram showing the construction of a prior art electromagnet drive device.
Figure 7:
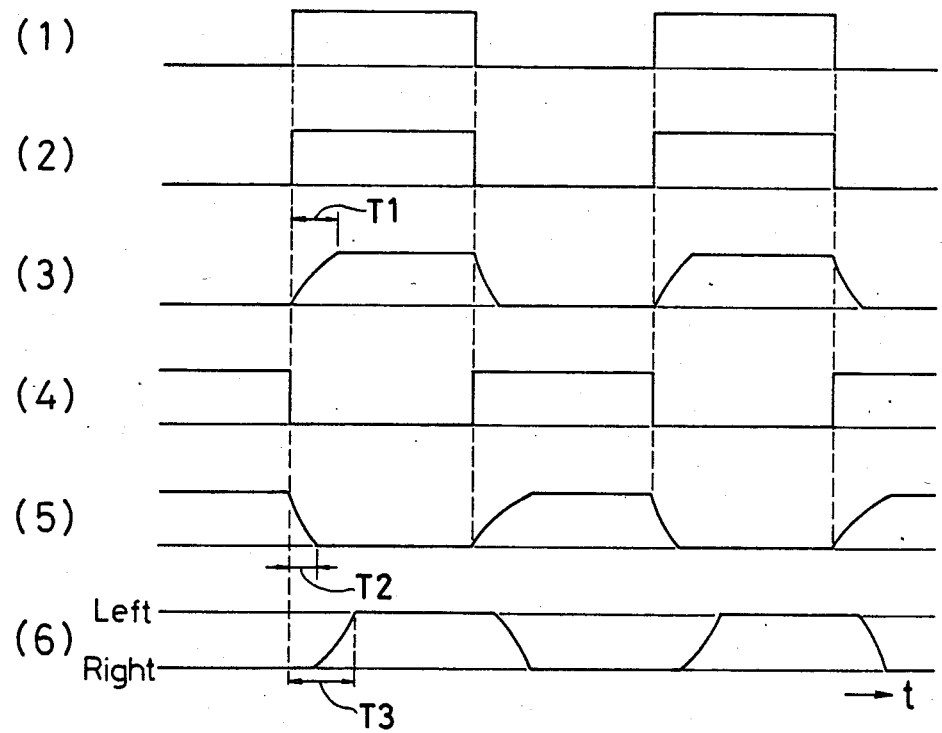
FIG. 7 is a timing chart explaining the operation of the prior art electromagnet drive device.
Figure 8:
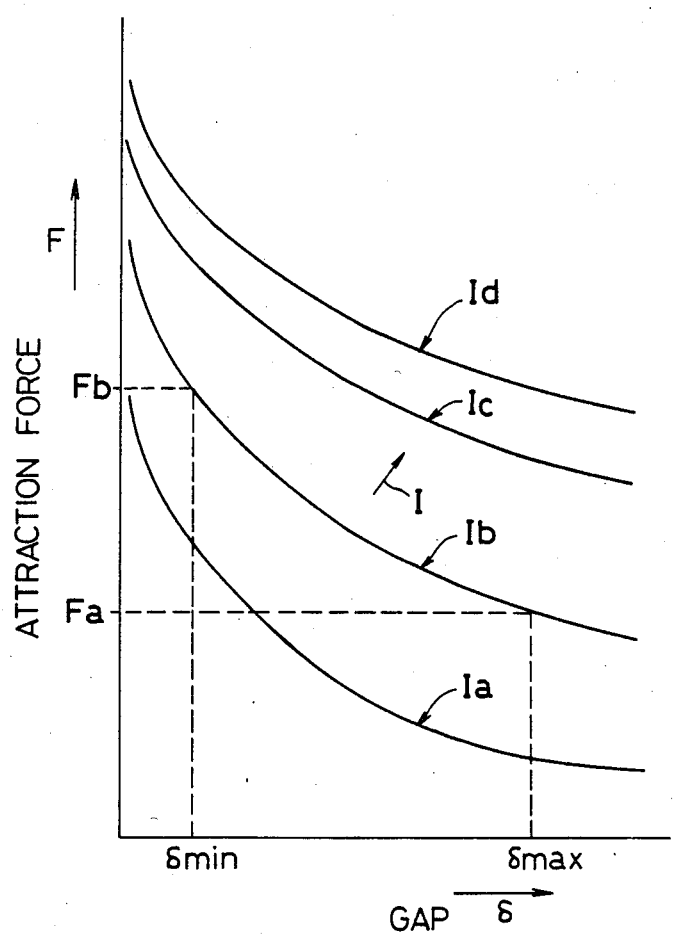
FIG. 8 is a graph showing one example of a typical attraction force characteristic of an electromagnet.

An embodiment of the present invention applied to a fuel injection control device 30 of an internal combustion engine is shown in FIG. 4, and the timing chart thereof in FIG. 5. FIG. 5 (1) shows a switchover command signal being the output of an RS flip-flop FF1, (2) a pre-energizing signal of coil SR being the output of an RS flip-flop FF2, (3) a pre-energizing signal of coil SL being the output of an RS flip-flop FF3, (4) the output signal of OR gate G17, (5) the output signal of OR gate G13, (6) the output signal of timer delay circuit TD11, (7) the operating state of a transistor QR1, (8) the operating state of a transistor QR2, (9) the operating state of a transistor QL1, (10) the operating state of a transistor QL2, (11) the current waveform flowing through coil SR, (12) the current waveform flowing through coil SL, and (13) the position changes of a switchover valve spool. When the spool is in the left position fuel is being injected, and when in the right position it is stopped. In FIG. 4 one electromagnet valve control unit is shown and the remaining control units are omitted. A resolver 31 detecting the crank angle of an engine is fitted to the crank, the analog output of this resolver 31 is applied to an A/D converter 32, and is derived as a digital signal being crank angle information. The output signal of the A/D converter 32 and the signals from a fuel injection start setting means 33, a fuel injection finish setting means 34, the pre-energizing timing setting means 35 of the coil SR, and the pre-energizing timing setting means 36 of the coil SL are input to decision means 37 to 40 respectively, which test to see if they are in agreement, and produce an output signal if they are in agreement. The fuel injection start timing is set by the crank angle, and the completion timing is determined by the revolution count control system, which is set by conversion from the crank angle. The timing of the fuel injection start setting is restricted to the range of 30 to 0 degrees before top dead center (TDC) of the piston, preceding that, the pre-energizing timing of the coil SR is set at 50 degrees before top dead center TDC, and the pre-energizing timing of the coil SL is set at a crank angle preceding the fuel injection finish timing. The crank angle changes as the engine rotates, and as each of the setting values agrees with the output signal of the A/D converter 32, pulse signals are produced by the decision means 37 to 40. As these pulse signals trigger the next stage RS flip-flops FF1 to FF3, from these outputs are obtained, from the fuel injection start the switchover command signal for the end thereof, from the pre-energizing timing of the coil SR until the start of fuel injection the pre-energizing signal of the coil SR, and from the pre-energizing timing of the coil SL until the finish of fuel injection the pre-energizing signal of the coil SL.

When the switchover command signal which is the output of RS flip-flop FF1, and the pre-energizing command signal of the coil SR which is the output of RS flip-flop FF2, are both low level, the output of OR gate G11 is low level and the transistor QR2 will be off. The output of the OR gate G11 is applied through the timer delay circuit TD11 to NAND gate G14, and as a result the output of the NAND gate G14 will be high level and the transistor QR1 will go off, and the current in the coil SR will be dissipated. On the other hand, the output of the OR gate G12 to one terminal of which is applied the output of NOT circuit IN1 the input of which is the output of the RS flip-flop FF1 becomes high level, and transistor QL2 adopts the on state. Again, since the output of the OR gate G17 is low level, the holding current value IH is selected by the switchover switch SW3, and the output of switchover switch SW3 is selected by switchover switch SW4. The holding current value IH is applied to the non-inverting input of a comparator CMP2 which has a hysteresis characteristic, and the current flowing through the coil SL is detected by the resistor R2, and applied to the inverting input of the comparator CMP2. Since the edge detector ED1 is outputting low level, the timer circuit TM12 does not operate, and its output is maintained low, as a result of which one input of the OR gate G15 is low level, and also the output of the OR gate G12 will pass through the timer delay circuit TD13 and make a high level input to the NAND gate G16, so that the output of the comparator CMP2 will turn the transistor switch QL1 on and off, and current will flow in the direction in the coil SL as shown by the solid line arrow A10 and broken line arrow A11 in the drawing, and the coil SL is driven in chopper mode at a rated current of the holding current IH. At this time, the electromagnet on the coil SL side is attracting, and the gap is small, so the spool of the switchover valve is pulled in the direction of the coil SL.

When the pre-energizing signal of the coil SR goes to the high level, the output of the OR gate G17 will go to the high level, and the holding increased current IHU will be selected by the switchover switch SW3. The current applied to the coil SL is increased, and it is driven in the chopper mode with a rated current of the holding increased current value IHU. On the other hand, the output of the gate G11 is high level, and the transistor QR2 adopts the on state, but the output of the timer circuit TD11 still continues at the low level for the interval TD. Therefore the output of the NAND gate G14 is also maintained at the high level, as a result of which the transistor QR1 continues in the off state, and current does not flow through the coil SR. When the interval Td has elapsed the output of the timer delay circuit TD11 becomes high level, and the output of the timer circuit TM12 is maintained at the low level, so that the comparator CMP1 having a hysteresis characteristic puts the transistor QR1 in the on/off state. Since the switchover command output of the RS flip-flop FF1 is low level, the standby energizing current IE is selected by the switch SW5, this current IE is applied to the non-inverting input terminal of the comparator CMP1, and the current flowing through the coil SR detected by the resistor R1 is input to the inverting input terminal of the comparator CMP1. The coil SR is therefore driven in chopper mode with a rated current of the standby energizing current value IE, and goes on standby. In the interval, the force maintaining the spool of the switchover valve on the left side is reduced by the attraction force of the coil SR, but since before then the current of the coil SL was increased from the holding current IH to the holding increased current IHU, there is no decrease in the coil SL attraction force compared with when it was driven in chopper mode with a rated current of the holding current value IH. If the attraction force for the holding current IH is very much larger than the fluid forces, the function of setting the holding increased current may be omitted, but in that case, compared with the case where the setting of the holding increased current function is necessary, the temperature increase of the electromagnet coils is greater, and the efficiency of the power supply is inferior. When the engine rotates and the crank angle coincides with the fuel injection start setting, the switchover command from the output of RS flip-flop FF1 changes from low level to high level, and the pre-energizing signal for the coil SR which is the output of the RS flip-flop FF2 changes from high level to low level. The output of the OR gate G12 goes to low level, the transistor QL2 adopts the off state, and the current flowing through the coil SL passes through the Zener diode ZDL and diode CL1 and is rapidly dissipated. The output of the OR gate G11 remains at the high level, so that the transistor QR2 stays in the on state. The edge detector ED1 detects e switchover command rising edge and sends out a pulse signal, the timer circuit TM12 is operated, and the output of the OR gate G13 is forcibly set to high level for the interval Ts. Since also the output of the timer delay circuit TD11 has already become high level, the output of the NAND gate G14 is made low level, and the transistor QR1 is put in the on state. In other words the current flowing in the coil SL is dissipated, and its attraction force is lost, whereas the current flowing in the coil SR is further increased, and an increase in the attraction force is obtained, so that the operation of the spool of the switchover valve can be speeded up. When the interval Ts set by the timer circuit TM12 has elapsed, the output of the timer circuit TM12 returns to the low level, and since the holding current value IH is applied to the comparator CMP1 through the switchover switches SW3 and SW5, the coil SR is driven in chopper mode with a rated current value of the holding current value IH.

As the engine rotates further, and the crank angle comes into agreement with the timing of the pre-energizing current for the coil SL, the output of the RS flip-flop FF3 which is the pre-energizing command signal for the coil SL becomes high, the coil SR switches to being driven in chopper mode with a rated current of the holding increased current value IHU, and after the interval Te set by the timer delay circuit TD13, the coil SL is driven in chopper mode with a rated current value of the standby energizing current value IE, and goes into standby. When in agreement with the fuel injection finish timing, the output of the RS flip-flop FF1 which is the switchover command signal, and the output of the RS flip-flop FF3 which is the pre-energizing command signal for the coil SL both go to low level, the transistor QR2 adopts the off state, the current flowing in the coil SR is rapidly dissipated, in the setting interval Ts of the timer circuit TM12 the transistor QL1 is forcibly turned on, so that the current flowing in the coil SL is increased. After that, the coil SR is driven in chopper mode with a rated current value of the holding current value IH, and the original state is returned to.

As above, according to the present invention, using a relatively low supply voltage it is possible to operate an electromagnet drive device at high speed; the many good features include good responsiveness of the electromagnet device and high reliability, and it is ideal for fine control in response to instrumentation, and for automatic computer control.

What is claimed is:

1. A method of driving a movable body using magnetic fields, comprising the steps of:
    supplying a holding current to a first coil which is holding said movable body;
    supplying an energizing current, of a level higher than said holding current to a second coil; and
    decreasing said holding current rapidly so that said body is rapidly switched to being held by said second coil.

2. A method as in claim 1 comprising the further steps of rapidly discharging the holding current using a discharge circuit in parallel across the first coil, the discharging circuit including a diode of reversed polarity to current flow.

3. An electromagnet drive device for driving an electromagnet device constructed with a pair of electromagnets and a movable body movable by alternately switching the electromagnetic forces thereof, comprising:
    first means for supplying a current to each coil of said pair of electromagnets to maintain said movable body in an electromagnetically held state;
    second means for supplying a pre-energizing current to at least one of said coils;
    control means for, (1) when a first of said coils is in a state of holding said movable body, causing a current to be supplied to said first coil maintaining the holding state and causing a pre-energizing current to be supplied to said second coil, (2) preceding a process of switching to holding by the second coil, increasing the current maintaining the holding state of the first coil, and (3) when holding is to be switched over to said second coil, causing the current maintaining said holding state to be suddenly reduced.

4. The electromagnet drive device described in claim 3 further comprising a circuit, connected in parallel with each said coil, said circuit comprising: (1) a diode connected with opposite polarity to the polarity of the energizing current, and (2) a nonlinear device which conducts when the coil back e.m.f. exceeds a certain predetermined value.

5. A device as in claim 4 wherein said nonlinear device is a zener diode.

6. A device as in claim 4 wherein said nonlinear device is a varistor.

7. A device as in claim 3 wherein, preceeding the process of switching to holding by the second coil, said preenergizing current applied to said second coil, is larger than said current applied to said first coil.

8. An electromagnetic drive device for driving a movable body, comprising:
   first coil means on a first side of said body, for producing a magnetic field on said first side of first body;
   second coil means on a second side of said body, for producing a magnetic field on said second side of said body;
   first means for driving said first coil means;
   second means for driving said second coil means; and
   control means, for:
   (1) supplying a holding current to said first coil means, and supplying an energizing current to said second coil means, to maintain said body on one side held by said magnetic field of said first coil means; and
   (2) switching said body from said one side held by said first coil means to another side held by said second coil means by
      (a) increasing said energizing current to said second coil means while said body is still being held by said magnetic field of said first coil means, said increased energizing current being higher than said holding current, and
      (b) subsequently decreasing said holding current rapidly, to cause a rapid movement of said body.

9. Apparatus as in claim 8 wherein said energizing current is higher than said holding current.

10. Apparatus as in claim 8 further comprising a bypass circuit in parallel with one of said coil means, said bypass circuit including a diode of opposite polarity to the direction of current flow, and a nonlinear element in series.

11. A drive device for driving a movable body, comprising:
    first coil means on a first side of said body, for producing a magnetic field on said first side of first body;
    second coil means on a second side of said body, for producing a magnetic field on said second side of said body;
    first means for driving said first coil means;
    second means for driving said second coil means; and
    control means for:
    (1) supplying a holding current to said first coil means, and supplying an energizing current of a level higher than a level of said holding current to said second coil means to maintain said body on one side held by said magnetic field of said first coil means; and
    (2) switching said body from said one side to another side held by said magnetic field of said second coil means by rapidly discharging said holding current.

12. An apparatus as in claim 11 further comprising a bypass circuit in parallel with said first coil means, including a diode of opposite polarity to said holding current, and a nonlinear element, in series with one another.

* * * * *